(12) United States Patent
Imanishi

(10) Patent No.: US 10,855,274 B2
(45) Date of Patent: Dec. 1, 2020

(54) SEMICONDUCTOR DEVICE

(71) Applicant: Mitsubishi Electric Corporation, Tokyo (JP)

(72) Inventor: Motoki Imanishi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/741,560

(22) Filed: Jan. 13, 2020

(65) Prior Publication Data
US 2020/0328741 A1   Oct. 15, 2020

(30) Foreign Application Priority Data
Apr. 12, 2019   (JP) .................................. 2019-076197

(51) Int. Cl.
*H03K 17/567* (2006.01)
*H01L 23/00* (2006.01)
*H03K 17/74* (2006.01)

(52) U.S. Cl.
CPC ........... *H03K 17/567* (2013.01); *H01L 24/45* (2013.01); *H03K 17/74* (2013.01); *H01L 2924/13055* (2013.01)

(58) Field of Classification Search
CPC ...... H03K 17/567; H03K 17/74; H01L 24/45; H01L 2924/13055
See application file for complete search history.

(56) References Cited

U.S. PATENT DOCUMENTS

| | | | | |
|---|---|---|---|---|
| 3,683,208 A | * | 8/1972 | Burens | H02M 7/537 323/312 |
| 9,367,383 B2 | * | 6/2016 | Henley | G06F 16/248 |
| 9,632,135 B2 | * | 4/2017 | Yanagishima | H03K 17/61 |
| 9,712,037 B2 | * | 7/2017 | Miyauchi | H02M 1/08 |
| 9,966,870 B2 | * | 5/2018 | Kondo | H02M 5/458 |
| 2007/0081280 A1 | * | 4/2007 | Strzalkowski | H02M 1/08 361/18 |
| 2013/0009674 A1 | * | 1/2013 | Reese | H03K 5/133 327/109 |

FOREIGN PATENT DOCUMENTS

JP    2010225952 A    10/2010
JP    2015149731 A    8/2015

* cited by examiner

*Primary Examiner* — Dinh T Le
(74) *Attorney, Agent, or Firm* — Studebaker & Brackett PC

(57) ABSTRACT

A semiconductor device includes: a first IGBT and a second IGBT to constitute an inverter; a primary-side IC chip to output an electrical signal responsive to an input signal; a first secondary-side IC chip to drive the first IGBT based on the electrical signal; and a second secondary-side IC chip to drive the second IGBT based on the electrical signal. The primary-side IC chip includes insulating elements electrically insulated from the first secondary-side IC chip and the second secondary-side IC chip. The first secondary-side IC chip is stacked on the first IGBT. The second secondary-side IC chip is stacked on the second IGBT.

6 Claims, 6 Drawing Sheets

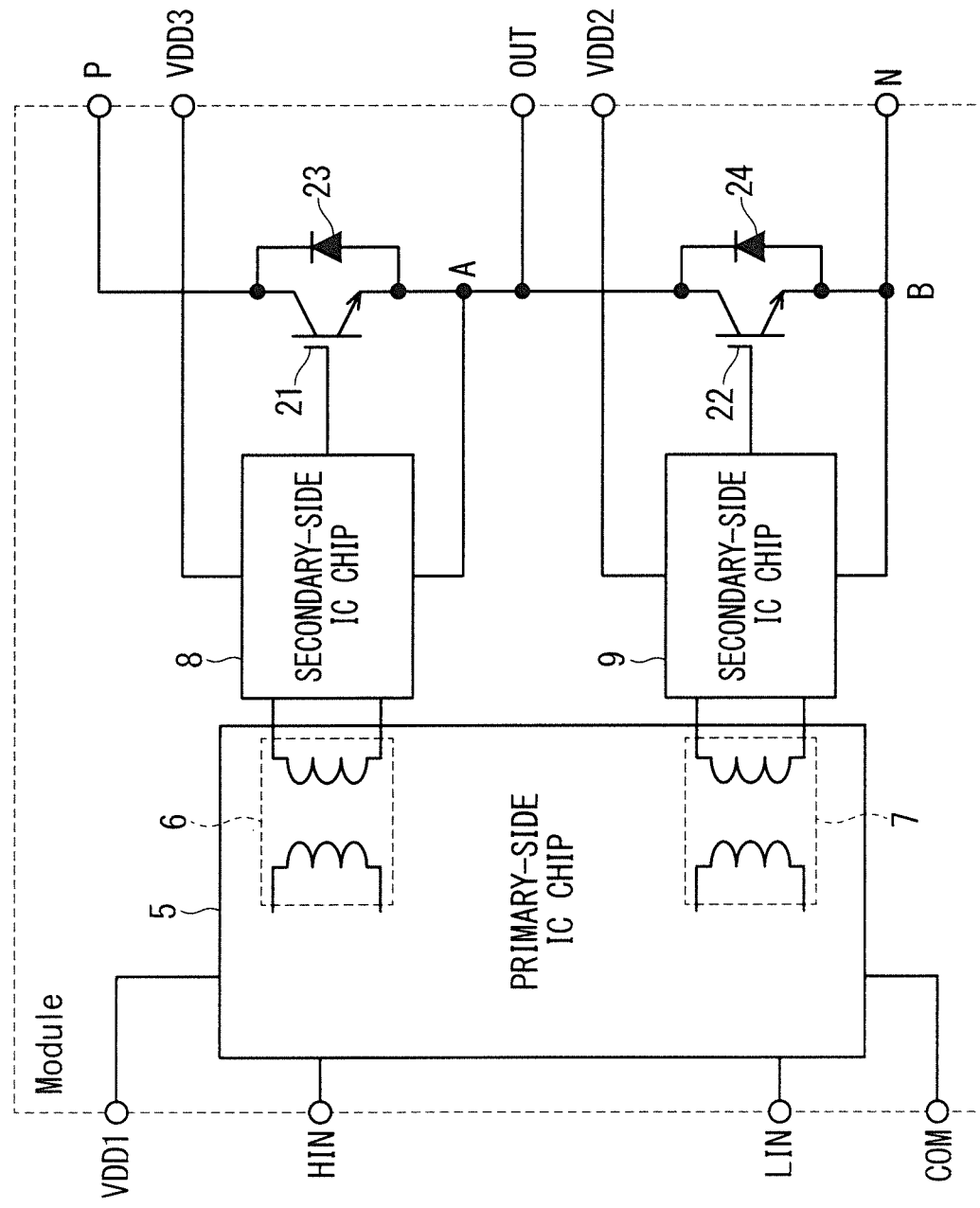
F I G. 1

SEMICONDUCTOR DEVICE

BACKGROUND OF THE INVENTION

Field of the Invention

The present invention relates to transfer-molded power modules.

Description of the Background Art

A transfer-molded power module for use in an inverter device includes switching elements arranged on lead frames and a control IC chip. In a case where an HVIC level shifter is used as a means of transferring signals to improve functionality and performance of the power module, there is a limitation on a transmission speed, malfunction, and the like. It is therefore necessary to use an insulating driver on which signal insulation is mounted, but the insulating driver formed on lead frames has a problem described below.

A conventional high-side driver has a single-chip configuration in which the HVIC level shifter is incorporated, whereas the insulating driver has a multi-chip configuration to secure insulation between a primary side and a secondary side. Secondary-side chips are required to be arranged on any of U, V, and W potential references, but cannot directly be arranged on a lead frame having a P potential as the lead frame has the potential. On the other hand, if the secondary-side chips are arranged on lead frames having U, V, and W potentials, chip arrangement is extremely complicated to deteriorate assembly, so that it is difficult to use the multi-chip configuration.

A conventional lead frame has a reference potential of a gate driver, but routing of wiring and lead frames of U, V, and W potentials is extremely increased to cause a malfunction.

A method of solving a problem of potentials caused when the insulating driver is mounted on the lead frames is disclosed in Japanese Patent Application Laid-Open No. 2015-149731 and Japanese Patent Application Laid-Open No. 2010-225952, for example. Japanese Patent Application Laid-Open No. 2015-149731 discloses technology of arranging a primary-side chip and a secondary-side chip on lead frames having different potentials in relation to functionality included in a multi-chip included in an insulating driver. Japanese Patent Application Laid-Open No. 2015-149731, however, does not disclose technology relating to a chip configuration of a power module.

Japanese Patent Application Laid-Open No. 2010-225952 discloses technology relating to a form of mounting a stacked chip. In the technology disclosed in Japanese Patent Application Laid-Open No. 2010-225952, when switching elements are connected in a totem pole, a high-side chip and a low-side chip are stacked to be mounted, and a control IC chip is further stacked. The switching elements are connected in the totem pole in a state of a collector potential as a rear-surface potential of the low-side chip being stacked on an emitter potential as a front-surface potential of the high-side chip, and an emitter potential as a front-surface potential of the low-side chip becoming a GND potential. The technology is technology of further connecting a rear-surface potential of the control IC chip to the emitter potential as the front-surface potential of the low-side chip to thereby connect the switching elements and the control IC chip through mounting by stacking.

In the technology disclosed in Japanese Patent Application Laid-Open No. 2010-225952, however, it is necessary to consider heat dissipation because the low-side chip and the high-side chip stacked to be mounted become hot, and it is further necessary to increase a difference in chip size to wire bond the low-side chip and the high-side chip after mounting by stacking. This can lead to reduction in degree of freedom of design of a semiconductor device.

SUMMARY

It is an object of the present invention to provide technology enabling improvement in degree of freedom of design when a semiconductor device has a stacked configuration in which a plurality of chips are stacked.

A semiconductor device according to the present invention includes a high-side switching element, a low-side switching element, a primary-side IC chip, a first secondary-side IC chip, and a second secondary-side IC chip. The high-side switching element and the low-side switching element constitute an inverter. The primary-side IC chip outputs an electrical signal responsive to an input signal. The first secondary-side IC chip drives the high-side switching element based on the electrical signal. The second secondary-side IC chip drives the low-side switching element based on the electrical signal. The primary-side IC chip includes an insulating element electrically insulated from the first secondary-side IC chip and the second secondary-side IC chip. The first secondary-side IC chip is stacked on the high-side switching element. The second secondary-side IC chip is stacked on the low-side switching element.

The high-side switching element and the low-side switching element are not stacked on each other, so that heat dissipation of the high-side switching element and the low-side switching element is not affected, and there is no need to increase a difference in chip size of them. A degree of freedom of design of the semiconductor device can thereby be improved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit block diagram showing one phase of a semiconductor device according to Embodiment 1;

DESCRIPTION OF THE PREFERRED EMBODIMENTS

Embodiment 1

Figure 2:
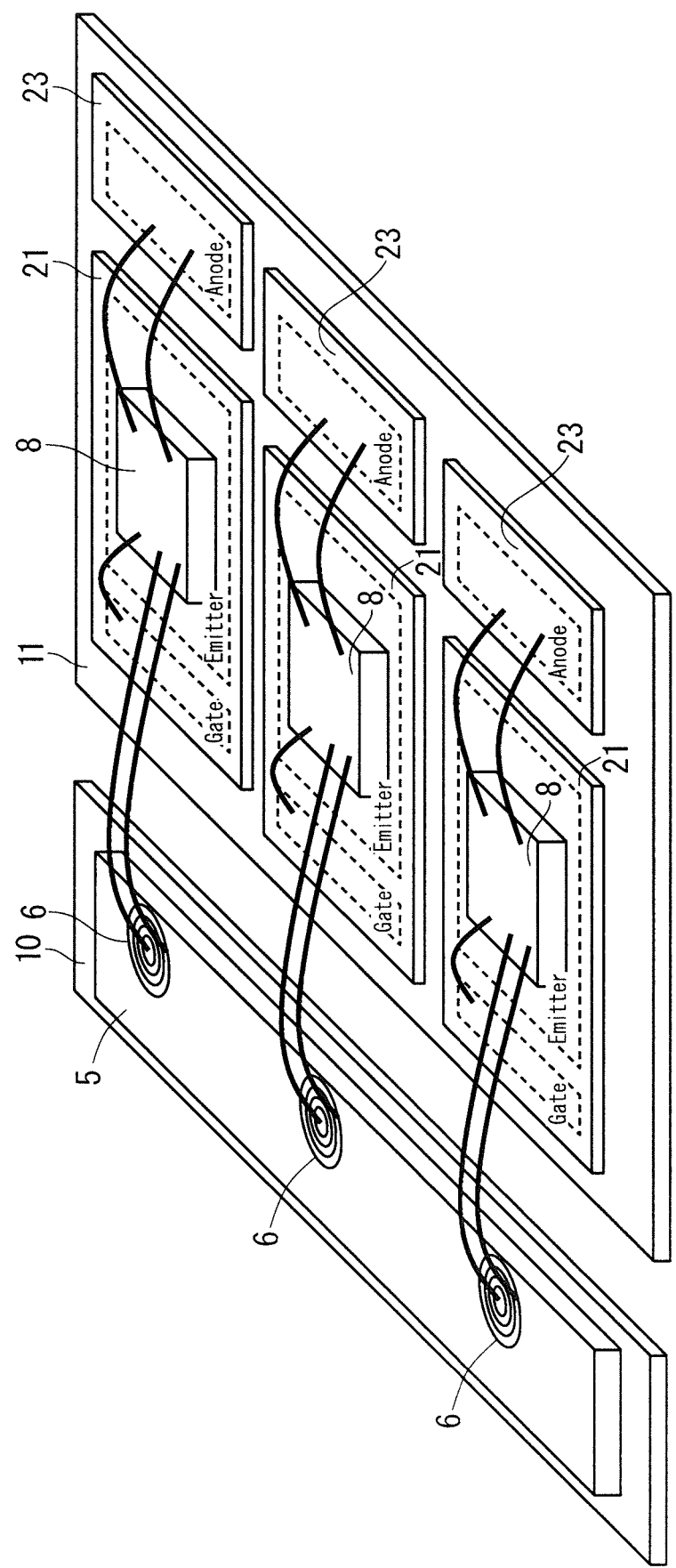
FIG. 2 is a schematic view illustrating a mounting method of the semiconductor device.
Figure 3:
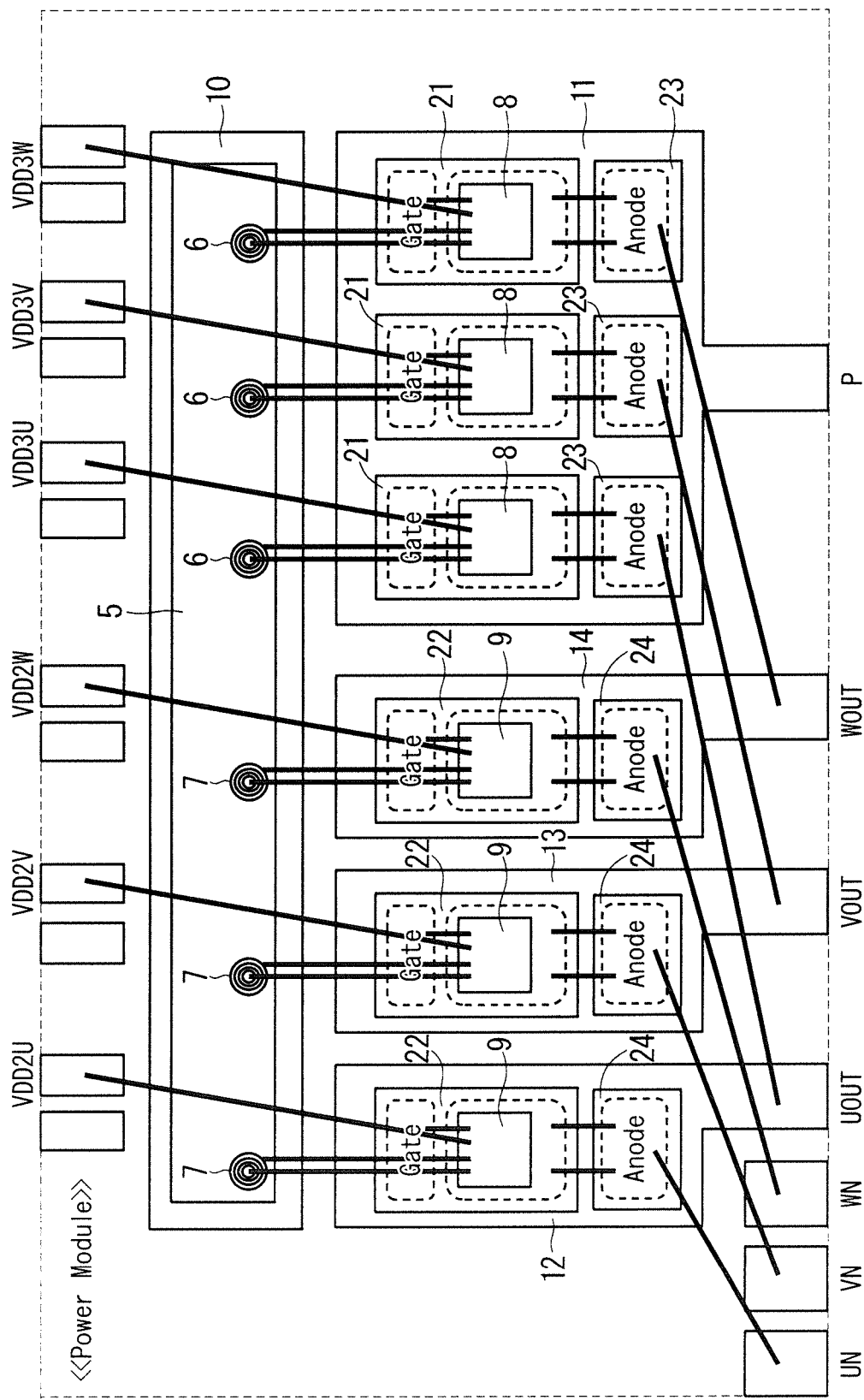
FIG. 3 is a plan view illustrating a state of chips being mounted on lead frames.

Embodiment 1 of the present invention will be described below with reference to the drawings. FIG. 1 is a circuit block diagram showing one phase of a semiconductor device according to Embodiment 1. FIG. 2 is a schematic view illustrating a mounting method of the semiconductor device. FIG. 3 is a plan view illustrating a state of chips being mounted on lead frames.

As shown in FIG. 1, the semiconductor device is a transfer-molded power module, and includes an insulated gate bipolar transistor (IGBT) 21 as a high-side switching element, an IGBT 22 as a low-side switching element, freewheeling diodes (FWD) 23 and 24, a primary-side IC chip 5, a secondary-side IC chip 8 as a first secondary-side IC chip, and a secondary-side IC chip 9 as a second secondary-side IC chip. The semiconductor device further includes a VDD1 terminal, a VDD2 terminal, a VDD3 terminal, an HIN terminal, a LIN terminal, a COM terminal, a P terminal, an OUT terminal, and an N terminal.

As shown in FIGS. 1 and 2, the primary-side IC chip 5 is mounted on a front surface of a lead frame 10 connected to a COM potential. A power supply electrode of the primary-side IC chip 5 is connected to the VDD1 terminal, and a current is supplied from the VDD1 terminal to the primary-side IC chip 5. The primary-side IC chip 5 includes insulating elements 6 and 7 electrically insulated from the secondary-side IC chips 8 and 9, and outputs electrical signals responsive to input signals input from the HIN terminal and the LIN terminal to the secondary-side IC chips 8 and 9.

As illustrated in FIGS. 2 and 3, the IGBT 21 and the secondary-side IC chip 8 are stacked, and the IGBT 22 and the secondary-side IC chip 9 are stacked. The IGBT 21 and the secondary-side IC chip 8 are joined together using solder, and the IGBT 22 and the secondary-side IC chip 9 are joined together using solder.

As illustrated in FIGS. 1 to 3, a power supply electrode of the secondary-side IC chip 8 is connected to the VDD3 terminal (VDD3U, VDD3V, and VDD3W terminals in FIG. 3), and a current is supplied from the VDD3 terminal to the secondary-side IC chip 8. The secondary-side IC chip 8 includes a driver (not illustrated) to drive the IGBT 21 based on the electrical signal output from the primary-side IC chip 5.

The IGBTs 21 and 22 constitute an inverter. The IGBT 21 is an SiC element, and is mounted on a front surface of a lead frame 11 connected to a P terminal A collector electrode is provided in a rear surface of the IGBT 21, and the collector electrode of the IGBT 21 is connected to the P terminal. A gate electrode and an emitter electrode are provided in a front surface of the IGBT 21, and the secondary-side IC chip 8 is mounted on the emitter electrode of the IGBT 21 (a connecting point A in FIG. 1). A reference potential electrode to provide a minimum potential of the secondary-side IC chip 8 is provided in a rear surface of the secondary-side IC chip 8, and thus the reference potential electrode of the secondary-side IC chip 8 is connected to the emitter electrode of the IGBT 21 (the connecting point A in FIG. 1).

As illustrated in FIGS. 1 and 3, a power supply electrode of the secondary-side IC chip 9 is connected to the VDD2 terminal (VDD2U, VDD2V, and VDD2W terminals in FIG. 3), and a current is supplied from the VDD2 terminal to the secondary-side IC chip 9. The secondary-side IC chip 9 includes a driver (not illustrated) to drive the IGBT 22 based on the electrical signal output from the primary-side IC chip 5.

The IGBT 22 is an SiC element, and is mounted on each of front surfaces of lead frames 12, 13, and 14 respectively connected to an UOUT terminal, a VOUT terminal, and a WOUT terminal. A collector electrode is provided in a rear surface of the IGBT 22, and the collector electrode of the IGBT 22 is connected to any of the UOUT terminal, the VOUT terminal, and the WOUT terminal. A gate electrode and an emitter electrode are provided in a front surface of the IGBT 22, and the secondary-side IC chip 9 is mounted on the emitter electrode of the IGBT 22 (a connecting point B in FIG. 1). A reference potential electrode to provide a minimum potential of the secondary-side IC chip 9 is provided in a rear surface of the secondary-side IC chip 9, and thus the reference potential electrode of the secondary-side IC chip 9 is connected to the emitter electrode of the IGBT 22 (the connecting point B in FIG. 1). The IGBTs 21 and 22 may not be the SiC elements but be GaN elements.

As shown in FIGS. 1 to 3, the FWD 23 is mounted on the front surface of the lead frame 11 connected to the P terminal. A cathode electrode is provided in a rear surface of the FWD 23, and the cathode electrode of the FWD 23 is connected to the P terminal. An anode electrode is provided in a front surface of the FWD 23, and the anode electrode of the FWD 23 is connected to the emitter electrode of the IGBT 21 by wires, and is connected to any of the UOUT terminal, the VOUT terminal, and the WOUT terminal by a wire.

As illustrated in FIGS. 1 and 3, the FWD 24 is mounted on each of the front surfaces of the lead frames 12, 13, and 14 respectively connected to the UOUT terminal, the VOUT terminal, and the WOUT terminal. A cathode electrode is provided in a rear surface of the FWD 24, and the cathode electrode of the FWD 24 is connected to any of the UOUT terminal, the VOUT terminal, and the WOUT terminal. An anode electrode is provided in a front surface of the FWD 24, and the anode electrode of the FWD 24 is connected to the emitter electrode of the IGBT 22 by wires, and is connected to any of a UN terminal, a VN terminal, and a WN terminal by a wire.

Figure 4:
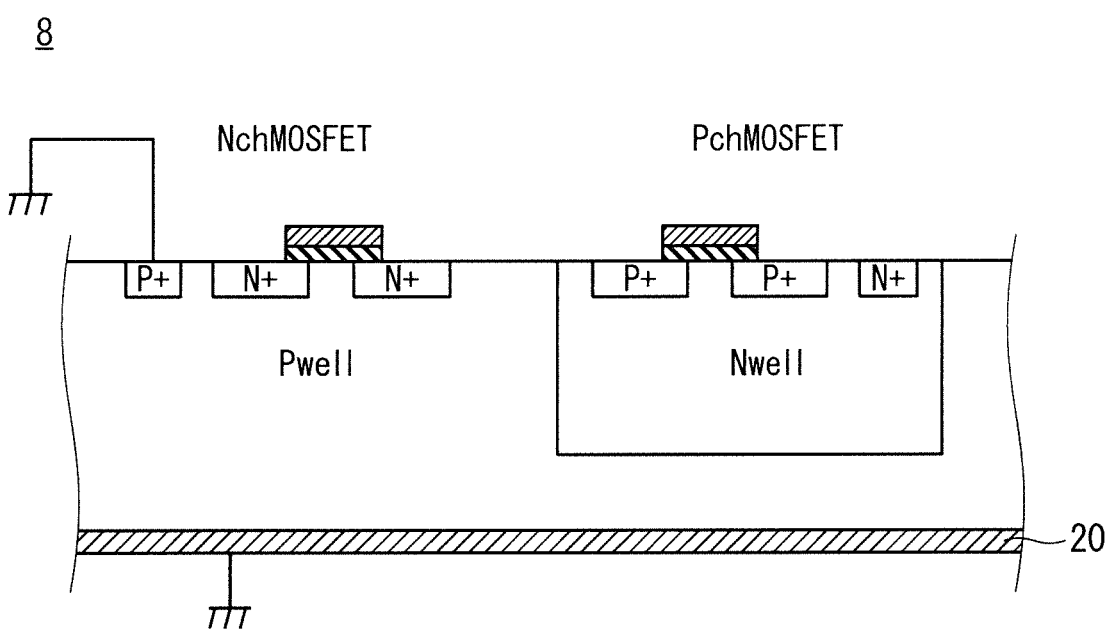
FIG. 4 is a sectional view of a secondary-side IC chip.

Connection to the IGBT 21 in a case where the secondary-side IC chip 8 is stacked on the front surface of the IGBT 21 will be described next. FIG. 4 is a sectional view of the secondary-side IC chip 8. Only the secondary-side IC chip 8 is described herein because the secondary-side IC chip 9 has a similar configuration to the secondary-side IC chip 8.

As illustrated in FIG. 4, the secondary-side IC chip 8 has a BCDMOS configuration, and includes an Nch MOSFET and a Pch MOSFET. A reference potential electrode 20 is provided in the rear surface of the secondary-side IC chip 8. The reference potential electrode 20 of the secondary-side IC chip 8 is stacked on the emitter electrode provided in the front surface of the IGBT 21 (see FIG. 2) to be electrically connected to the emitter electrode of the IGBT 21. A reference potential (minimum potential) of the secondary-side IC chip 8 thus becomes (approximately) equal to an emitter potential of the IGBT 21.

As described above, the semiconductor device according to Embodiment 1 includes the IGBTs 21 and 22 to constitute the inverter, the primary-side IC chip 5 to output the electrical signals responsive to the input signals, the secondary-side IC chip 8 to drive the IGBT 21 based on the electrical signal, and the secondary-side IC chip 9 to drive the IGBT 22 based on the electrical signal. The primary-side IC chip 5 includes the insulating elements 6 and 7 electrically insulated from the secondary-side IC chips 8 and 9. The secondary-side IC chip 8 is stacked on the IGBT 21. The secondary-side IC chip 9 is stacked on the IGBT 22.

The IGBTs 21 and 22 are not stacked on each other, so that heat dissipation of the IGBTs 21 and 22 is not affected, and there is no need to increase a difference in chip size of them. A degree of freedom of design of the semiconductor device can thereby be improved.

Since the secondary-side IC chip 8 is stacked on the emitter electrode of the IGBT 21, and the secondary-side IC chip 9 is stacked on the emitter electrode of the IGBT 22, the reference potential electrodes 20 of the secondary-side IC chips 8 and 9 can be connected to the emitter electrodes of the IGBTs 21 and 22 without using any wires. Parasitic inductance and wiring resistance relating to connection between the secondary-side IC chips 8 and 9 and the IGBTs 21 and 22 can thereby be reduced.

Embodiment 2

Figure 5:
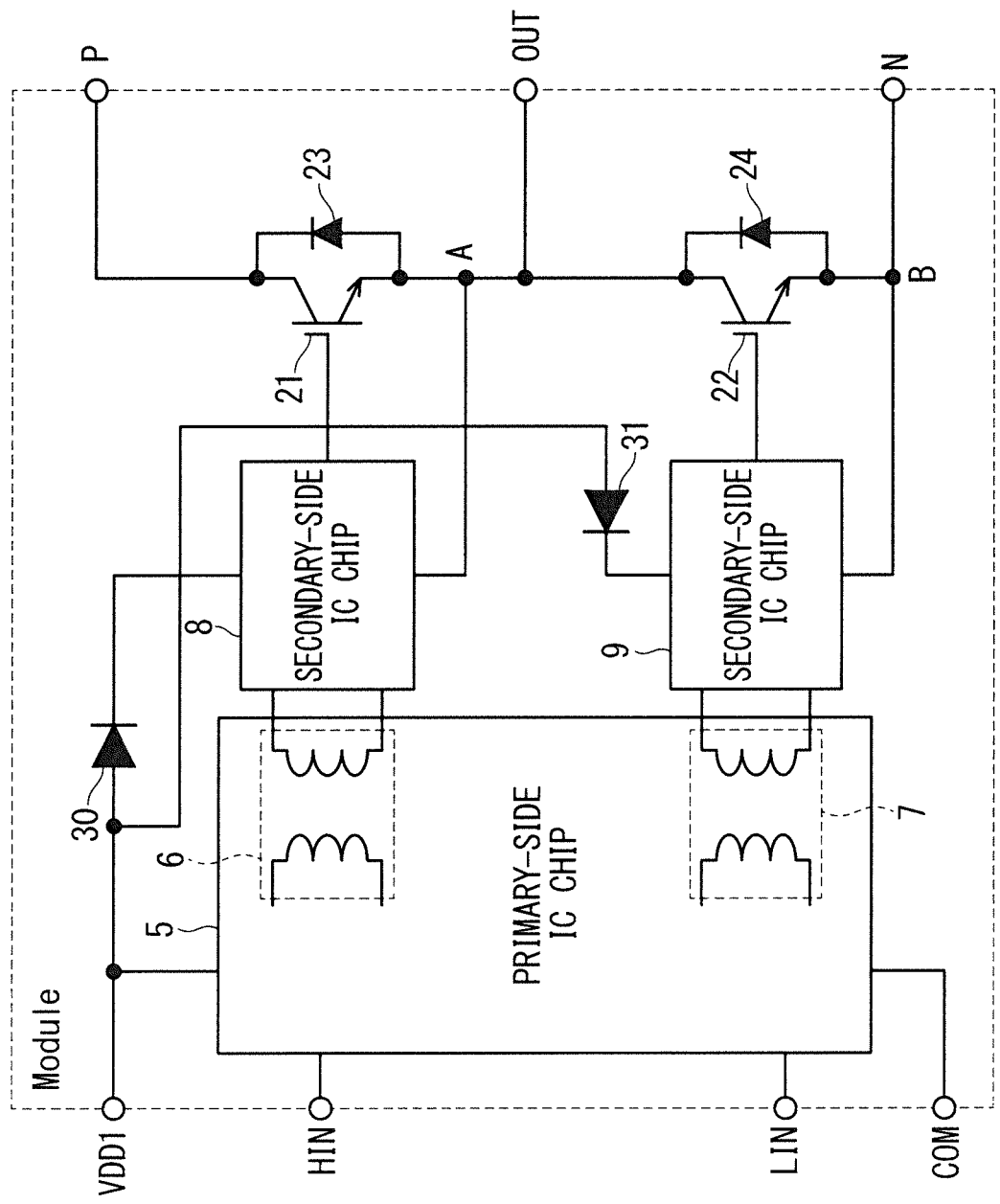
FIG. 5 is a circuit block diagram showing one phase of a semiconductor device according to Embodiment 2.

A semiconductor device according to Embodiment 2 will be described next. FIG. 5 is a circuit block diagram showing one phase of the semiconductor device according to Embodiment 2. In Embodiment 2, the same components as those described in Embodiment 1 bear the same reference signs as those in Embodiment 1, and description thereof is omitted.

As shown in FIG. 5, the semiconductor device further includes bootstrap diodes 30 and 31 in Embodiment 2.

The bootstrap diode 30 is connected to the secondary-side IC chip 8, and the bootstrap diode 31 is connected to the secondary-side IC chip 9. Specifically, an anode of the bootstrap diode 30 is connected to a power supply connected to the power supply electrode of the primary-side IC chip 5, and a cathode of the bootstrap diode 30 is connected to the power supply electrode of the secondary-side IC chip 8.

Similarly, an anode of the bootstrap diode 31 is connected to the power supply connected to the power supply electrode of the primary-side IC chip 5, and a cathode of the bootstrap diode 31 is connected to the power supply electrode of the secondary-side IC chip 9. The bootstrap diodes 30 and 31 enable the supply of currents from the power supply to the power supply electrodes of the secondary-side IC chips 8 and 9.

As described above, the semiconductor device according to Embodiment 2 further includes the bootstrap diodes 30 and 31 having the anodes connected to the power supply connected to the power supply electrode of the primary-side IC chip 5 and the cathodes connected to the power supply electrodes of the secondary-side IC chips 8 and 9. The bootstrap diodes 30 and 31 supply the currents from the power supply to the power supply electrodes of the secondary-side IC chips 8 and 9. The secondary-side IC chips 8 and 9 can thus share the power supply of the primary-side IC chip 5, so that the number of power supplies can be reduced to one.

Embodiment 3

Figure 6:
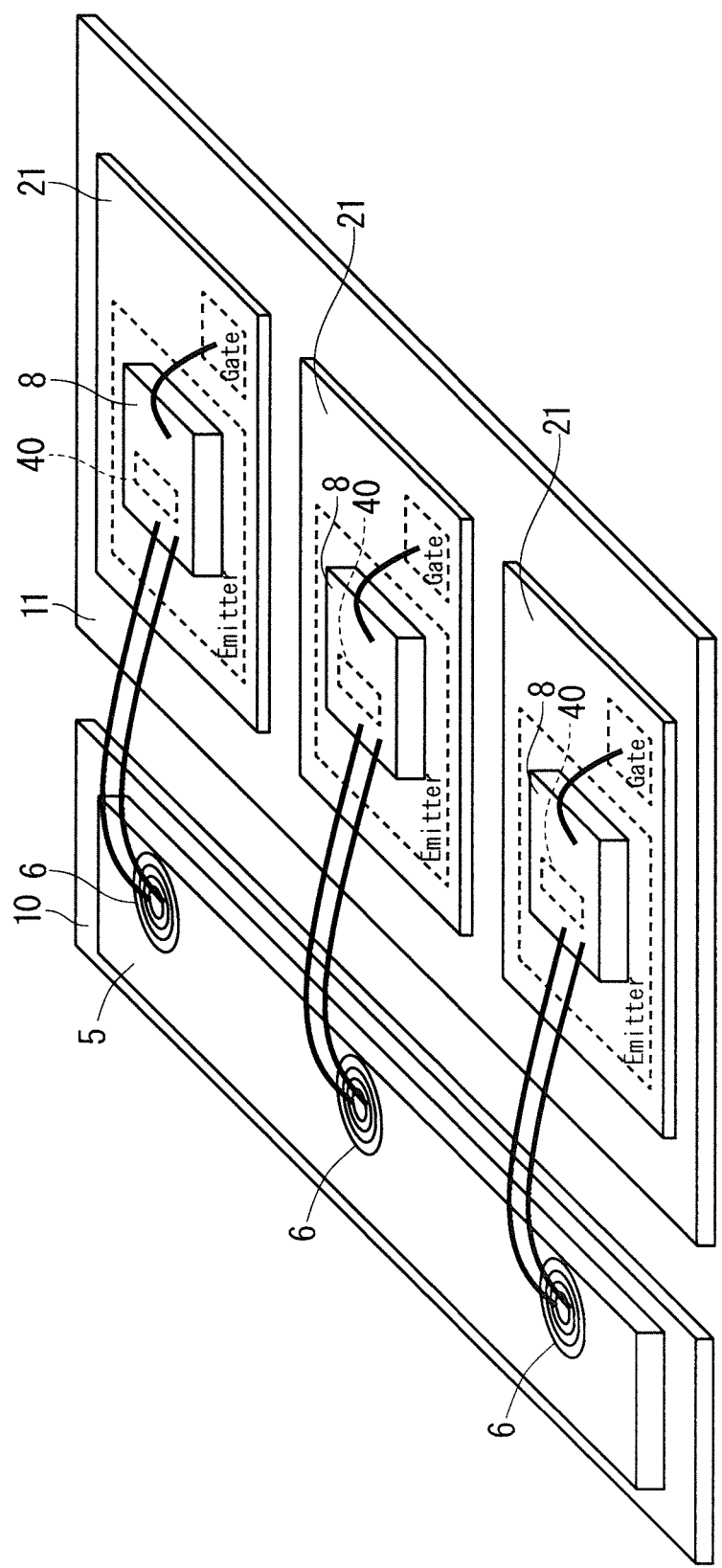
FIG. 6 is a schematic view illustrating a mounting method of a semiconductor device according to Embodiment 3.

A semiconductor device according to Embodiment 3 will be described next. FIG. 6 is a schematic view illustrating a mounting method of the semiconductor device according to Embodiment 3. The FWDs 23 and 24 and connection thereto are not illustrated. In Embodiment 3, the same components as those described in Embodiments 1 and 2 bear the same reference signs as those in Embodiments 1 and 2, and description thereof is omitted.

As illustrated in FIG. 6, in Embodiment 3, a temperature sense diode 40 is incorporated in the secondary-side IC chip 8 so that a junction temperature of the IGBT 21 can be detected. Although the secondary-side IC chip 9 is not illustrated in FIG. 6, the temperature sense diode 40 is incorporated also in the secondary-side IC chip 9 so that the junction temperature of the IGBT 22 can be detected. The junction temperature herein refers to the temperature of a PN junction in each of the IGBTs 21 and 22.

As described above, in the semiconductor device according to Embodiment 3, the temperature sense diode 40 is incorporated in each of the secondary-side IC chips 8 and 9 to eliminate the need for a temperature sense mounted on each of the IGBTs 21 and 22. Only the secondary-side IC chips 8 and 9 are thus arranged on the emitter electrodes of the IGBTs 21 and 22 to eliminate the need for a region in which the temperature sense is mounted, so that chip shrink of the IGBTs 21 and 22 can be achieved.

As described in Embodiment 1, the IGBTs 21 and 22 are the SiC elements. As the region in which the temperature sense is mounted is unnecessary, unused regions and costs of the IGBTs 21 and 22 can be reduced.

Alternatively, in a case where the IGBTs 21 and 22 are the GaN elements, as the region in which the temperature sense is mounted is unnecessary, the unused regions and the costs of the IGBTs 21 and 22 can be reduced. Furthermore, in high carrier driving characterizing the GaN elements, it is possible to take advantage of a high speed of the driver of each of the secondary-side IC chips 8 and 9.

Embodiments of the present invention can freely be combined with each other, and can be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a high-side switching element and a low-side switching element to constitute an inverter;
    a primary-side IC chip to output an electrical signal responsive to an input signal;
    a first secondary-side IC chip to drive the high-side switching element based on the electrical signal; and
    a second secondary-side IC chip to drive the low-side switching element based on the electrical signal, wherein
    the primary-side IC chip includes an insulating element electrically insulated from the first secondary-side IC chip and the second secondary-side IC chip,
    the first secondary-side IC chip is stacked on the high-side switching element,
    the second secondary-side IC chip is stacked on the low-side switching element, and
    at least one of the following:
    the first secondary-side IC chip is stacked on a surface of an emitter electrode of the high-side switching element, and
    the second secondary-side IC chip is stacked on a surface of an emitter electrode of the low-side switching element.

2. The semiconductor device according to claim 1, wherein
    the first secondary-side IC chip is stacked on the surface of the emitter electrode of the high-side switching element, and
    the second secondary-side IC chip is stacked on the surface of the emitter electrode of the low-side switching element.

3. The semiconductor device according to claim 1, further comprising
    a bootstrap diode having an anode connected to a power supply connected to a power supply electrode of the primary-side IC chip and a cathode connected to power supply electrodes of the first secondary-side IC chip and the second secondary-side IC chip, wherein the bootstrap diode supplies a current from the power supply to the power supply electrodes of the first secondary-side IC chip and the second secondary-side IC chip.

4. The semiconductor device according to claim 1, wherein
a temperature sense diode is incorporated in each of the first secondary-side IC chip and the second secondary-side IC chip.

5. The semiconductor device according to claim 4, wherein
the high-side switching element and the low-side switching element are SiC elements.

6. The semiconductor device according to claim 4, wherein
the high-side switching element and the low-side switching element are GaN elements.

\* \* \* \* \*